United States Patent
Ren et al.

(10) Patent No.: US 8,248,288 B2
(45) Date of Patent: Aug. 21, 2012

(54) ANALOG TO DIGITAL CONVERTER WITH AMPLIFIER

(75) Inventors: Juxiang Ren, Austin, TX (US); Robert S. Jones, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 86 days.

(21) Appl. No.: 12/867,452

(22) PCT Filed: Feb. 27, 2008

(86) PCT No.: PCT/US2008/055119
§ 371 (c)(1),
(2), (4) Date: Aug. 12, 2010

(87) PCT Pub. No.: WO2009/108191
PCT Pub. Date: Sep. 3, 2009

(65) Prior Publication Data
US 2010/0321226 A1    Dec. 23, 2010

(51) Int. Cl.
*H03M 1/38* (2006.01)
(52) U.S. Cl. .......... 341/161; 341/155; 341/156
(58) Field of Classification Search .......... 341/161, 341/155, 156
See application file for complete search history.

(56) References Cited

U.S. PATENT DOCUMENTS

| | | | |
|---|---|---|---|
| 5,894,284 A | 4/1999 | Garrity et al. | |
| 6,608,583 B1 | 8/2003 | Konno | |
| 6,870,495 B1 | 3/2005 | Zadeh et al. | |
| 6,888,482 B1 | 5/2005 | Hertle | |
| 7,250,895 B2 * | 7/2007 | Kurose et al. | 341/155 |
| 7,265,703 B2 * | 9/2007 | Sasaki et al. | 341/161 |
| 7,417,574 B2 * | 8/2008 | Tadeparthy et al. | 341/155 |
| 7,471,228 B2 * | 12/2008 | Cho et al. | 341/162 |
| 2004/0160351 A1 | 8/2004 | Rossi | |

FOREIGN PATENT DOCUMENTS
JP    10-163875    6/1998

OTHER PUBLICATIONS
PCT/US2008/055119 International Search Report and Written Opinion mailed Sep. 30, 208.
Hsin-Hung et al.; "A 0.7-V 10-bit 3uW Analog-to-Digital Converter for Implantable Biomedical Applications"; Biomedical Circuits and Systems Conference; Nov. 29, 2006; pp. 122-125; IEEE.
Hwei-Yu et al.; "A 10-Bit 100MS/s Pipelined ADC in 0.18um CMOS Technology"; IEEE International SOC Conference; Sep. 26, 2007; pp IEEE.

* cited by examiner

*Primary Examiner* — Jean B Jeanglaude
(74) *Attorney, Agent, or Firm* — David G. Dolezal; James L. Clingan, Jr.

(57) ABSTRACT

An analog to digital converter has an input circuit, a computation circuit, an initialization circuit, and an output circuit. The input circuit is for receiving an analog signal and has a pair of outputs. A computation circuit has a pair of inputs coupled to the pair of outputs. The computation circuit has an amplifier having a pair of complementary outputs (Outp, Outn). The initialization circuit is coupled to the complementary outputs and is for biasing the complementary outputs at a time prior to the computation circuit beginning a computation on the analog signal. The output circuit is coupled to the pair of complementary outputs and provides a digital signal.

21 Claims, 4 Drawing Sheets

ANALOG TO DIGITAL CONVERTER WITH AMPLIFIER

This application is a 371 National Filing of and claims priority to Application Number PCT/US2008/055119 filed on Feb. 27, 2008.

BACKGROUND OF THE INVENTION

1. Field of the Invention

This invention relates in general to analog to digital converters and more specifically to amplifiers for analog to digital converters.

2. Description of the Related Art

Digital to analog converters utilize amplifiers for converting analog signals to digital values representative of the analog signals. Some analog to digital converters may take several cycles to be placed in a state for data conversion.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
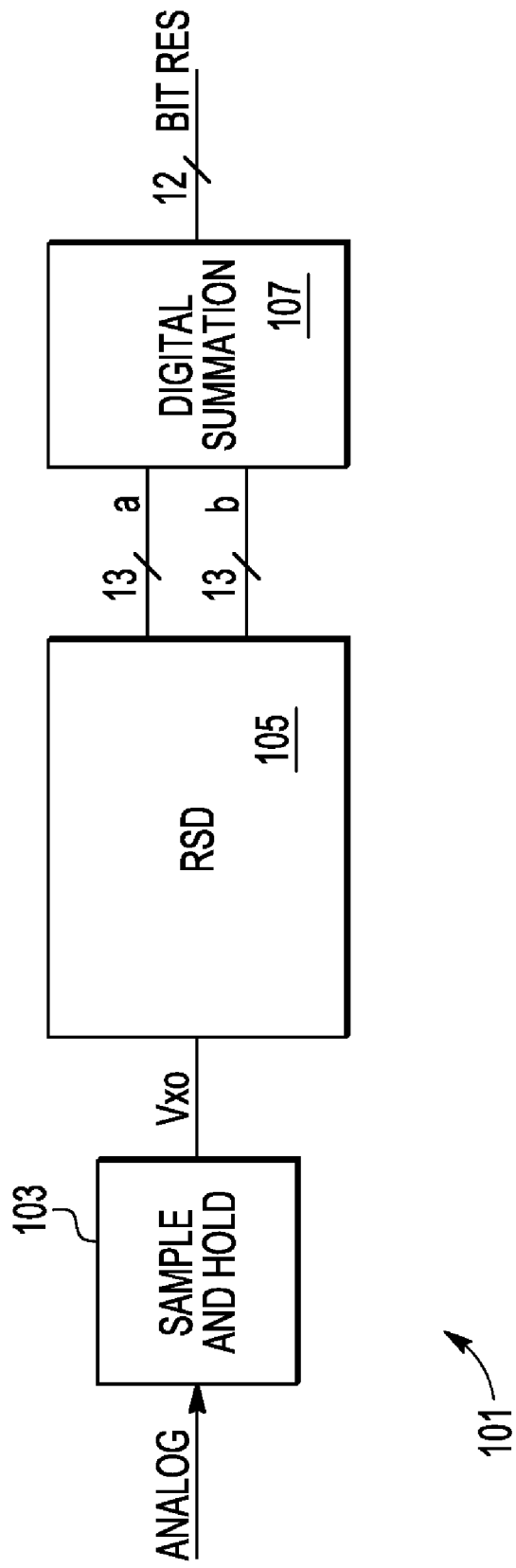
FIG. 1 is a block diagram of an analog to digital converter according to one embodiment of the present invention.

FIG. 1 is a block diagram of an analog to digital converter (ADC). In the embodiment shown, ADC 101 is a redundant sign division ADC that utilizes a redundant sign division architecture to convert an analog signal to a digital value. ADC 101 includes a sample and hold circuit 103, a redundant sign division (RSD) block 105, and a digital summation block 107. Sample and hold circuit 103 provides a sampled signal of an analog input signal at a particular point in time. In the embodiment shown, block 107 outputs a 12 bit digital value that is representative of the voltage of the analog signal at a particular point in time.

RSD block 105 uses an RSD architecture to convert the sampled analog signal (Vxo) from the sample and hold circuit 103. In the embodiment shown, RSD block 105 produces a number of two bit code values representative of the output of each iteration of the circuitry of the RSD block 105. In the embodiment shown, block 105 outputs 13 2-bit values (shown as the "a" bit and the "b" bit). Digital summation block 107 converts the 13 2-bit values to a 12 bit digital value.

A redundant sign division architecture is an analog to digital conversion architecture that utilizes a redundant sign division algorithm for converting an analog value to a digital value. RSD ADCs typically convert an analog signal to a corresponding digital value through a series of iterations. During an initial iteration, the voltage of the sampled analog signal is compared to two or more reference voltages and the results of these comparisons produce code bits for the initial iteration. A residue voltage is calculated following the first conversion. In a subsequent iteration, the residue voltage is compared against the reference voltages resulting in additional codes. This process of generating a residue voltage from a previous iteration and comparing the residue voltage to the reference voltages can be repeated for a number of iterations until the desired resolution is reached. Summation block 107 then manipulates the code values to form a digital value of the analog signal.

Figure 2:
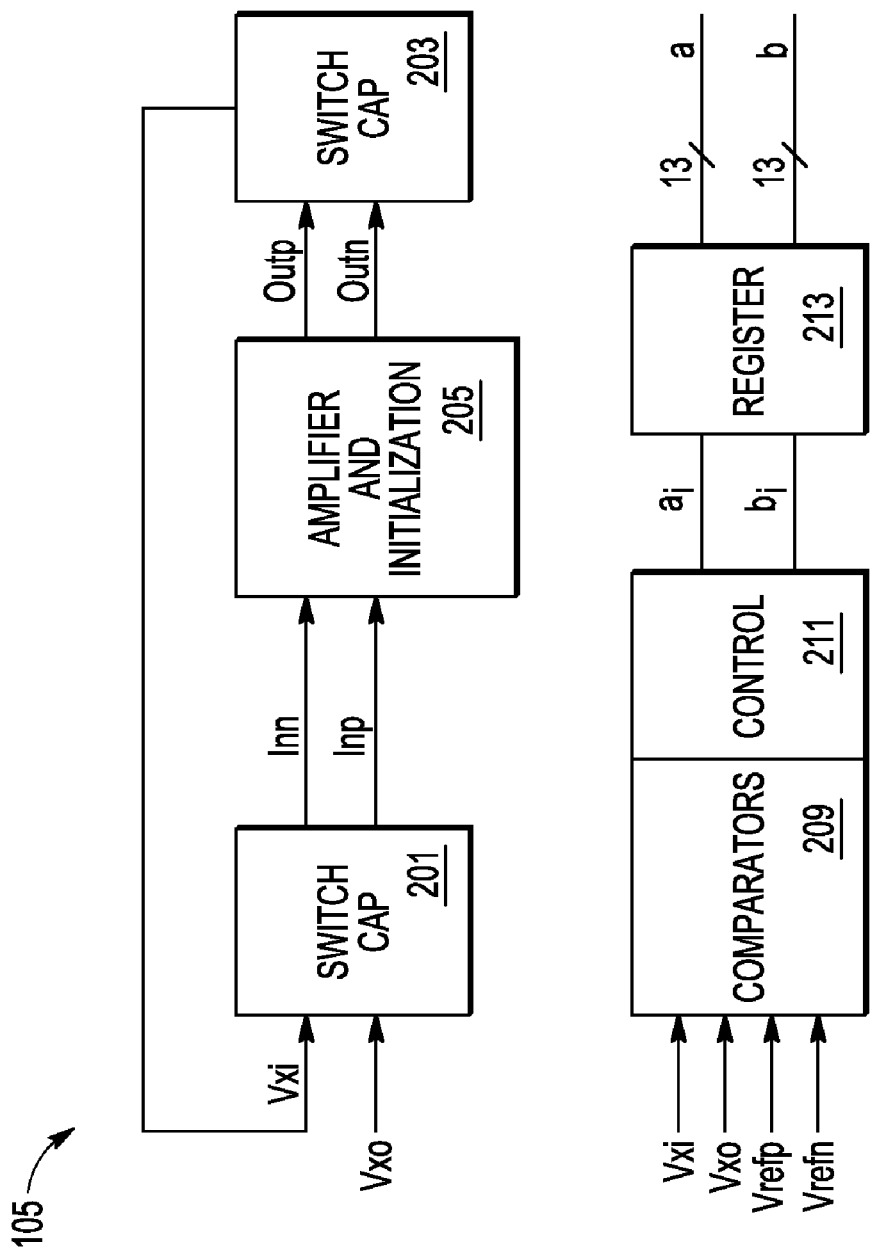
FIG. 2 is a block diagram of a computation circuit according to one embodiment of the present invention.

FIG. 2 is a block diagram of one embodiment of RSD block 105. RSD block 105 includes switch capacitor circuits 201 and 203, amplifier and initialization circuit 205, comparator 209, control circuit 211, and register 213. Switch capacitor circuits 201 and 203 and amplifier circuit 205 are utilized to generate the residue voltage (Vxi) from the original voltage Vxo (or from a previous Vxi in subsequent iterations). Switch capacitors are utilized to generate multiples of the input voltage (Vxo or Vxi in subsequent generations) for generating the residue voltages (Vxi) in subsequent iterations. Comparator 209 compares the voltage values (either initial Vxo or residue Vxi) with the reference voltages Vrefp and Vrefn. Control circuit 211 generates the code bits (ai and bi) for each iteration from the comparisons. It also generates the control signals by adding or subtracting the reference values during the comparisons. Register 213 holds the codes for each iteration where then entire set of codes are provided to summation block 107.

Other ADCs may have other configurations or implement other analog to digital algorithms in other embodiments.

Figure 3:
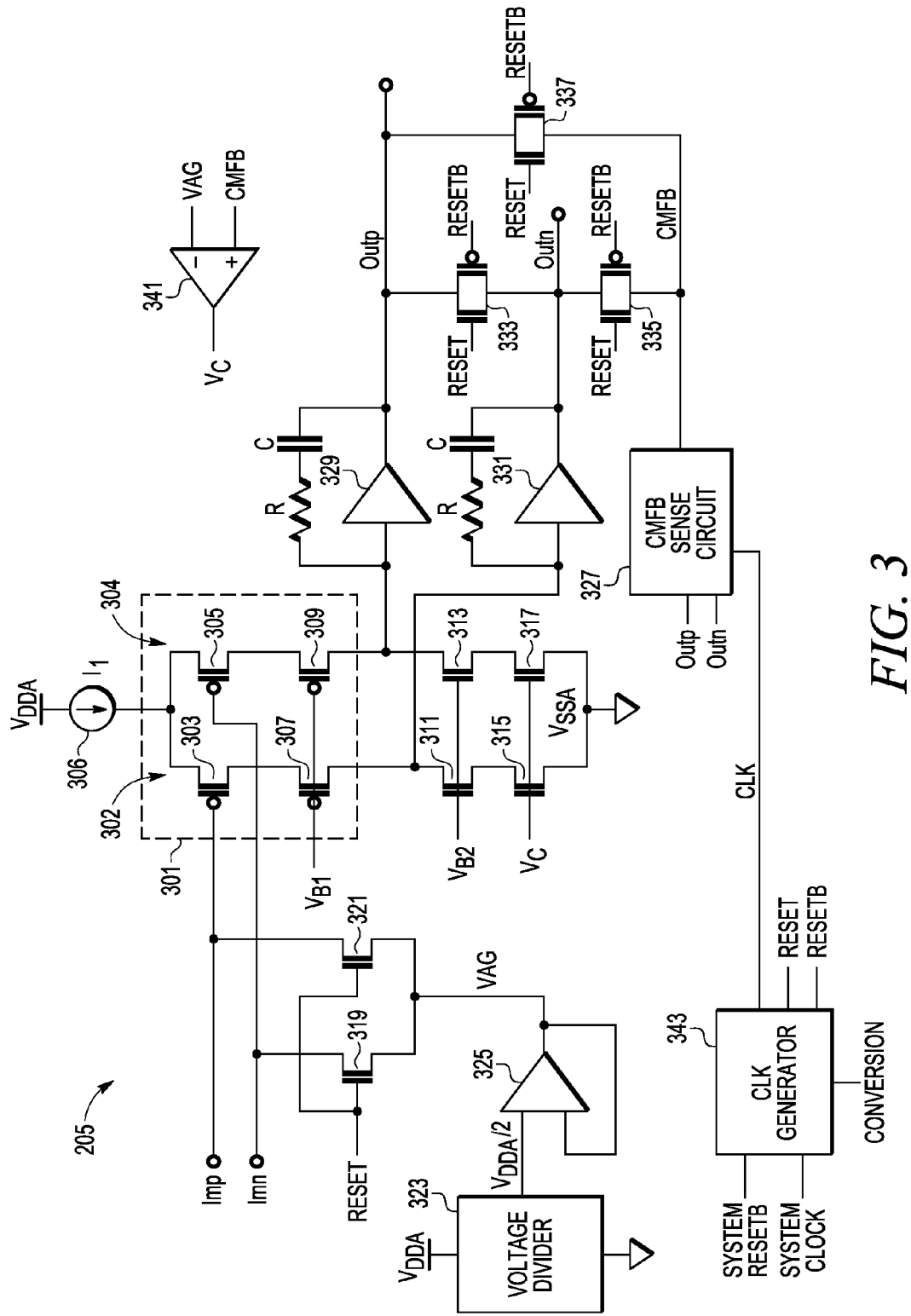
FIG. 3 is a circuit diagram of an amplifier and initialization circuit according to one embodiment of the present invention.

FIG. 3 is one embodiment of amplifier and initiation circuit 205. In the embodiment shown, circuit 205 receives a differential input signal (complementary signals Imp and Imn) an provides a differential output signal (complementary signals Outp and Outn) at a gain for enabling the RSD algorithm with switch capacitor circuits 201 and 203. Circuit 205 includes an input stage 301 of four P-channel transistors, differential transistor 303, differential transistor 305, coupling transistor 307, and coupling transistor 309. Circuit 205 also includes N-channel transistor 311, 313, 315, and 317. These transistors form two sets 302 and 304 of series stacked transistors which are each coupled in series to current source 306.

Circuit 205 includes two amplifiers 329 and 331, each connected to a node of series stacked transistor sets 304 and 302, respectively. The inputs and outputs of each amplifier 329 and 331 are coupled together with a resistor capacitor (RC) circuit. The output of amplifier 329 produces the Outp signal and the output of amplifier 331 produces the Outn signal.

Circuit 205 includes a common mode feedback (CMFB) sense circuit 327. Circuit 327 receives as inputs the Outp and Outn signals and a clock (Clk) signal and provides a common mode feedback (CMFB) signal at its output. The CMFB signal, when driven by circuit 327, is an average of the Outp and Outn signals. When the Clk signal is a series of clock pulses, the CMFB signal is generated from a switched capacitor circuit located in circuit 327 whose switches open and close with the clock pulses. When the clock signal is held high or low, an average is not produced by the circuit. Instead, the value of the CMFB is not driven by the circuit 327.

Circuit 205 also includes an initialization circuit that includes transistors 319 and 321 and passgates 333, 335, and 337 (which include parallel N channel and P channel transistors). These transistors and passgates are controlled by a Reset signal (and ResetB signal for the passgates which is an inverse signal of the Reset signal). These transistors and passgates act as switches for initializing the inputs Imp and Imn and outputs Outp and Outn of the amplifier circuit 205.

Transistors 307 and 309 are biased at a first bias voltage (VB1) and transistors 311 and 313 are biased at a second bias voltage (VB2). The values of VB1 and VB2 are selected to place transistors 307, 309, 311, and 313 in saturation as well as to protect transistors 303, 305, 307, and 309. In one embodiment, VB2 is biased at a voltage of at least 2 times VDSATS+VT where VDSATS is the saturation voltage across the source and the drain of transistors 311 and 313 and VT is the voltage threshold of transistors 311 and 313. In one embodiment, VB1 is biased to ensure that transistors 303, 305, 307, and 309 are within saturation, and where the gates of transistors 303 and 305 can support a reasonable amount of input voltage swing.

One current terminal of each of transistors 319 and 321 is biased at a VAG voltage. The VAG voltage is produced by a voltage divider 323 and buffer 325 from the higher voltage VDDA. The value of VAG is set to a voltage value that the inputs Imp and Imn are to be biased during an initialization period when the Reset signal is asserted. In one embodiment, VAG is ½ of VDDA. However, it may be other ratios in other embodiments.

The Reset and Reset B signals and the clock signal (Clk) are produced by a clock generator circuit 343 from a system clock, a system reset signal (system resetB), and a conversion signal (Conversion). When the system reset signal is asserted (at a low voltage), circuit 343 holds the Clk signal to either a high or low voltage and asserts the Reset and ResetB signals. When system reset is not asserted and the Conversion signal is asserted, the Clk signal is a series of pulses and the Reset and ResetB signals are not asserted.

The gates of transistors 315 and 317 are controlled by common mode feedback amplifier 341. The inputs to amplifier 341 are the VAG voltage and the CMFB signal. During a conversion operation, amplifier 341 biases transistors 315 and 317 to produce voltages by amplifiers 331 and 329 such that the average common mode voltage of the outputs Outp and Outn (as determined by circuit 327) is equal to VAG.

In one embodiment, transistors 303, 305, 307, and 309 are "low voltage" transistors as compared to transistor 319, 321, 311, 313, 315, 317, and the transistors of pass gates 333, 335, and 337 in that the gate dielectrics of those transistors (303, 305, 307, and 309) are thinner than the gate dielectrics of the other transistors. In one embodiment, the gate dielectric thicknesses of the low voltage transistors are 65 Angstroms wherein the dielectric thickness of the higher voltage transistors are 150 Angstroms. However, other embodiments may have gate dielectrics of other thicknesses. The low voltage transistors have a lower breakdown voltage than the higher voltage transistors with thicker gate dielectrics. Having transistors 303, 305, 307, and 309 be transistors with thinner gate dielectrics allows for amplifier circuit 205 to operate faster, have less voltage mismatch, assist in obtaining a higher beta factor for switch capacitor circuits 201 and 203, consume lower power due to lower current consumption, and be of reduced size due to improved current mobility than a circuit where theses transistors have thicker gate dielectrics.

In the embodiment shown, transistors 319 and 321 are used to bias Imp and Imn at a known voltage (VAG) during startup. Biasing the inputs of an amplifier circuit at a known voltage during startup inhibits damage to transistors 303 and 305 thereby enabling the lower voltage transistors to be used in the embodiment shown. Also, transistors 307, 309, 311, and 313 provide a voltage drop during operation to protect transistors thereby enabling those transistors (303, 305, 307, and 309) to be implemented with lower voltage transistors in the embodiment shown. In one embodiment, the breakdown voltage of transistors 307, 309, 311 and 313 is less than voltage VDDA.

Figure 4:
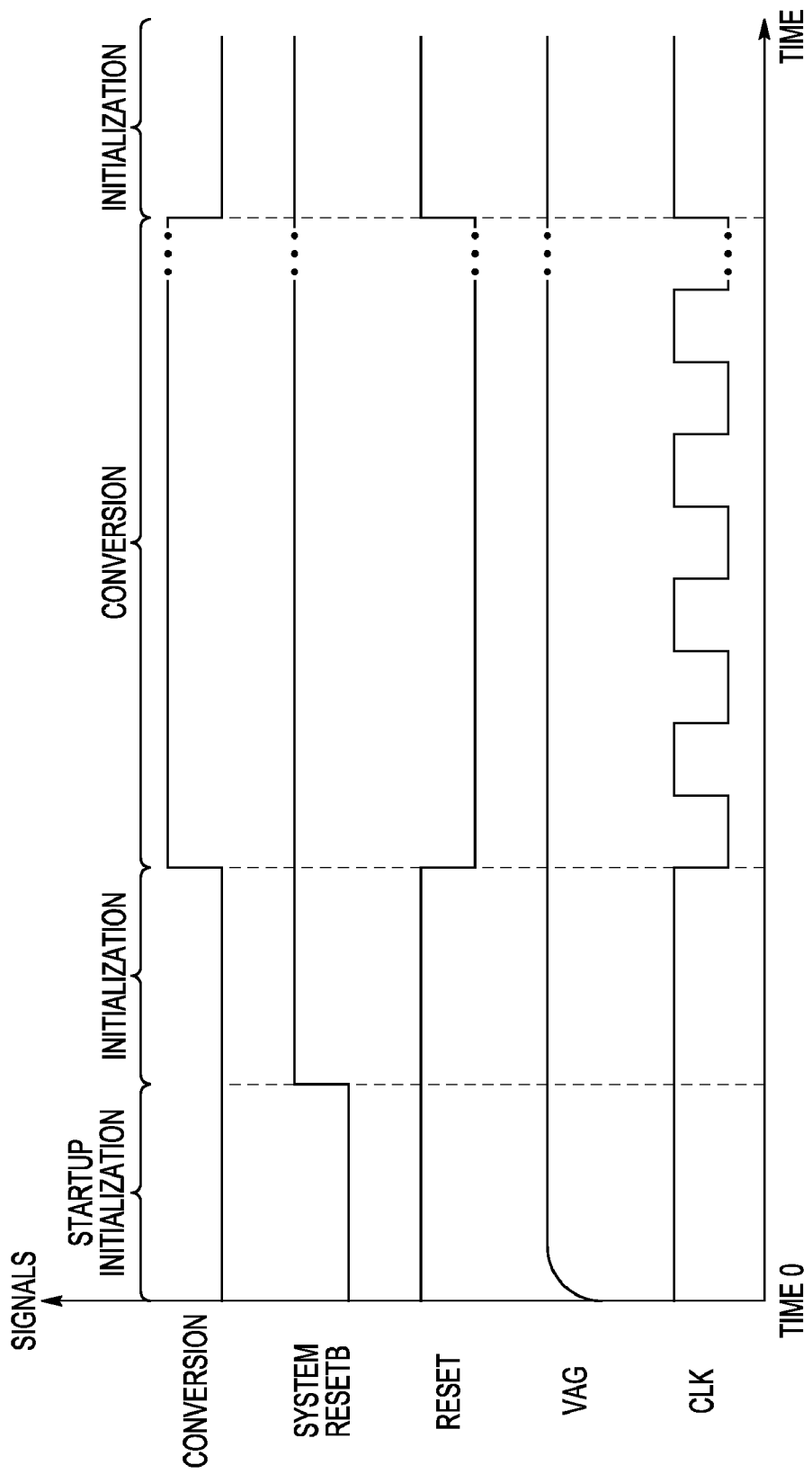
FIG. 4 is a timing diagram according to one embodiment of the present invention.

FIG. 4 is a timing diagram showing the operation of circuit 205 during a start up initialization mode, and initialization mode, a conversion mode, and a subsequent initialization mode.

When the system is first initialized (start up initialization mode), the system reset (System ResetB) is at an asserted low voltage. Accordingly, clock generation circuit 343 produces an asserted high voltage for the Reset signal and the Clk signal is held at a high voltage phase. The VAG voltage climbs to its normal value as the system voltages startup.

Referring back to FIG. 3, during this first initialization period, transistors 319 and 321 are conductive and passgates 333, 335, and 337 are conductive. Transistors 319 and 321 being conductive biases the Imp and Imn signals at VAG.

Passgates 333, 335, and 337 being conductive connects the outputs of amplifier 329 and amplifier 331 together and connects them to the signal line of the CMFB signal. With the Clk signal being at a high value, the voltage level of the CMFB signal is not driven by circuit 327 at that time, but is instead being driven by the outputs of amplifiers 329 and 331. Because the CMFB signal line is connected to the non inverting input of amplifier 341 and the VAG voltage is supplied to the inverting input of amplifier 341, the voltage Vc is set by amplifier 341 at a voltage such that CMFB will equal VAG. Accordingly, during an initialization mode of circuit 205, outputs Outp and Outn will be equalized and biased at VAG as well.

Biasing the outputs Outp and Outn at VAG during initialization places the outputs at a state that allows subsequent conversations to take place immediately. With the embodiment shown, the outputs Outp and Outn are equalized and biased at VAG such that circuit 205 can begin conversion at that moment. With some systems that do not bias the outputs during initialization, it may take the amplifier circuit 3 or 4 clock cycles for those outputs to arrive at a value for conversion to begin. Furthermore, the outputs are biased as a voltage level (VAG) that will be the common mode voltage of the outputs during conversion.

Utilizing the common feedback mode circuitry 327 for biasing the outputs provides for an efficient mechanism for output node bias of an amplifier circuit during an initialization mode that takes advantage of existing driver circuitry of those nodes to bias to the amplifier circuitry at an initiation voltage without additional driver circuitry for biasing the nodes. Furthermore, it allows for the outputs to be biased during initialization at the common mode feed back voltage.

Referring back to FIG. 4, after the System reset is deasserted, the amplifier goes into initialization mode. The amplifier transitions to a conversion mode from an initialization mode with the assertion of the Conversion signal (Conversion) to the clock generation circuit 343 to indicate the start of a conversion cycle. In response, circuit 343 deasserts the Reset and ResetB signal and initiates pulses on the Clk signal. In response to the deassertion of the Reset signal, transistors 319, and 321 and passgates 333, 335, and 337 become non conductive. Transistors 319 and 321 becoming non conductive removes the VAG bias to inputs Imp and Imn. These signals are then driven by switch capacitor circuit 201 for conversion operations. With Passgates 335, 333, and 337 being non conductive, the outputs of amplifiers 329 and 331 are no longer tied to each other and the CMFB signal. With the clock circuit providing a series of clock pluses, the circuit 327 drives the CMFB signal to an average of the Outp and Outn signals. Amplifier 341 provides Vc at a level such that the output of circuit 327 will equal VAG.

Amplifier will be in the conversion mode where circuit 205 aids in the calculation of residue voltages for the RSD algorithm until the deassertion of the Conversion signal. At that time, the circuit 205 goes back into an initialization mode where the Reset signal is asserted and the Clk signal is held at a high phase. At this time, the System ResetB remains in its unasserted mode.

Although amplifier circuit 205 is shown and described as being used in an RSD ADC, such an amplifier circuit (or one similar to circuit 205) may be used with other types of ADCs such as e.g. sigma delta ADCs, successive approximation register ADCs, and correlated double sampling based ADCs. Furthermore, other types of ADC differential output amplifiers may be configured to use CMFB circuitry to provide output biasing during initialization or reset modes. For example, in one embodiment, the amplifier may have a single ended input.

In one embodiment, an analog to digital converter includes an input circuit for receiving an analog signal and a computation circuit coupled to the input circuit. The computation circuit includes an amplifier having a pair of inputs, a pair of complementary outputs, a terminal for receiving a power supply voltage, and an initialization circuit. The initialization circuit is coupled to the complementary outputs. The initialization circuit is for biasing the complementary outputs at a first voltage less than the power supply voltage at a time prior to the computation circuit beginning a computation on an analog signal. In one embodiment, the computation circuit performs computations on a sampled analog signal. The analog to digital converter includes an output circuit coupled to the computation circuit and providing a digital signal.

In another embodiment, in an analog to digital converter including a computation circuit used in receiving sampled analog signal values and performing a plurality of computations for each sampled analog signal value, the computation circuit including an amplifier. The amplifier includes a power supply terminal for receiving a power supply voltage, complementary outputs, and an initialization circuit for biasing the complementary outputs at a first voltage less than the power supply voltage prior to beginning a plurality of computations for each sampled analog signal value.

Another embodiment includes a method of performing analog to digital conversion in a system including an amplifier wherein the amplifier has a pair of complementary outputs. The method includes powering the amplifier at a first voltage, biasing the complementary outputs at a second voltage that is less than the first voltage, sampling an analog signal to provide a sampled analog signal. The method includes after biasing, performing computations for analog to digital conversion on the sampled analog signal. The method also includes providing a digital signal representative of the sampled analog signal.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An analog to digital converter, comprising:
    an input circuit for receiving an analog signal;
    a computation circuit coupled to the input circuit, the computation circuit includes an amplifier having a pair of inputs, a pair of complementary outputs, a terminal for receiving a power supply voltage, and an initialization circuit, wherein the initialization circuit is coupled to the complementary outputs, wherein the initialization circuit is for biasing the complementary outputs at a first voltage less than the power supply voltage at a time prior to the computation circuit beginning a computation on an analog signal; and
    an output circuit coupled to the computation circuit and providing a digital signal.

2. The analog to digital converter of claim 1, wherein the computation circuit comprises a circuit implementing a redundant signed division architecture.

3. The analog to digital converter of claim 1, wherein:
    the initialization circuit includes a common mode feed back circuit;
    wherein the pair of complementary outputs are coupled to inputs of the common mode feed back circuit, wherein the common mode feed back circuit has an output for providing a feed back signal to a signal line for controlling the common mode voltage of the amplifier during a computation operation of an analog signal by the amplifier;
    wherein the initialization circuit connects the signal line to the pair of complementary outputs at the time prior to the computation circuit beginning a computation on an analog signal.

4. The analog to digital converter of claim 3, wherein the amplifier wherein the initialization circuit includes a second amplifier having a first input coupled to the signal line, a second input for receiving the first voltage, and an output for controlling conductivity of a pair of transistors of the first amplifier.

5. The analog to digital converter of claim 3, wherein:
    a common mode voltage of the pair of complementary outputs is at the first voltage during a computation operation of an analog signal.

6. The analog to digital converter of claim 3, wherein the amplifier comprises:
    a second amplifier including an output coupled to a first of the pair of complementary outputs;
    a third amplifier including an output coupled to a second of the pair of complementary outputs;
    wherein the initialization circuit includes a switch circuit connecting the output of the second amplifier and the output of the third amplifier at a time prior to the computation circuit beginning a computation on an analog signal.

7. The analog to digital converter of claim 1, wherein the amplifier comprises:
    a first plurality of transistors having a first gate dielectric thickness and a second plurality of transistors having a second gate dielectric thickness that is less than the first gate dielectric thickness, wherein the second set of transistors includes a first transistor having a control terminal coupled to a first input of the pair of inputs and a second transistor having a control terminal coupled to a second input of the pair of inputs.

8. The analog to digital converter of claim 1 wherein the initialization circuit equalizes the complementary outputs at a time prior to the computation circuit beginning a computation on an analog signal.

9. The analog to digital converter of claim 1, wherein:
    the initialization circuit biases the inputs at the first voltage at a time prior to the computation circuit beginning a computation on an analog signal.

10. The analog to digital converter of claim 1, wherein the amplifier comprises:
a plurality of P channel transistors and a plurality of N channel transistors;
a first input P channel transistor having a gate coupled to a first input of the pair of inputs;
a second input P channel transistor having a gate coupled to a second input of the pair of inputs;
a third P channel transistor in series with the first input P channel transistor;
a fourth P channel transistor in series with the second input P channel transistor;
the first input P channel transistor, second input P channel transistor, the third P channel transistor, and the fourth P channel transistor have a breakdown voltage lower than a breakdown voltage of the plurality of P channel and N channel transistors of the first plurality.

11. In an analog to digital converter (ADC) including a computation circuit used in receiving sampled analog signal values and performing a plurality of computations for each sampled analog signal value, the computation circuit including an amplifier, the amplifier comprising:
a power supply terminal for receiving a power supply voltage;
complementary outputs; and
an initialization circuit for biasing the complementary outputs at a first voltage less than the power supply voltage prior to beginning a plurality of computations for each sampled analog signal value.

12. The amplifier of claim 11 wherein the first voltage is approximately half of the power supply voltage.

13. The amplifier of claim 11, further comprising:
a plurality of N channel transistors having a first gate dielectric thickness;
a first plurality of P channel transistors having a second gate dielectric thickness; and
a second plurality of P channel transistors having a third gate dielectric thickness that is less than the first gate dielectric thickness and the second gate dielectric thickness; and
wherein the second plurality of P channel transistors includes a differential pair of P channel transistors and a pair of P channel coupling transistors in series with the differential pair of P channel transistors.

14. The amplifier of claim 11 wherein the initialization circuit further comprises:
a common mode feed back circuit having inputs coupled to the complementary outputs, the common mode feed back circuit having an output coupled to a signal line, wherein in biasing the complementary outputs, the initialization circuit couples the signal line to the complementary outputs, wherein the output of the common mode feed back circuit provides an indication of a common mode voltage of the complementary outputs during a computation operation of the amplifier.

15. A method of performing analog to digital conversion in a system including an amplifier wherein the amplifier has a pair of complementary outputs, the method comprising:
powering the amplifier at a first voltage;
biasing the complementary outputs at a second voltage that is less than the first voltage;
sampling an analog signal to provide a sampled analog signal;
after biasing, performing computations for analog to digital conversion on the sampled analog signal; and
providing a digital signal representative of the sampled analog signal.

16. The method of claim 15 wherein the performing computations includes performing computations for an Redundant Sign Division analog to digital algorithm.

17. The method of claim 15, wherein the biasing further includes:
equalizing the complementary outputs.

18. The method of claim 15 wherein the amplifier has a pair of complementary inputs, the method comprising:
biasing the pair of complementary inputs at the second voltage during the biasing.

19. The method of claim 15 further comprising:
producing a common mode feed back signal on a signal line and biasing the complementary outputs of the amplifier as per the common mode feed back signal to produce a desired common mode voltage of the complementary outputs during the performing computations;
wherein the step of biasing the complementary outputs at a second voltage includes coupling the complementary outputs to the signal line.

20. The method of claim 15 further comprising:
biasing the complementary outputs of the amplifier to produce a common mode voltage of the complementary outputs at the second voltage during the performing computations.

21. The method of claim 15, wherein the first voltage has a magnitude greater than a breakdown voltage of a plurality of P channel transistors of the amplifier, the method comprising:
biasing the plurality of P channel transistors to a voltage below the breakdown voltage.

* * * * *